United States Patent
Xia et al.

(10) Patent No.: US 11,749,693 B2
(45) Date of Patent: Sep. 5, 2023

(54) MANUFACTURING METHOD OF ARRAY SUBSTRATE, ARRAY SUBSTRATE AND DISPLAY DEVICE

(71) Applicants: BEIHAI HKC OPTOELECTRONICS TECHNOLOGY CO., LTD., Beihai (CN); HKC CORPORATION LIMITED, Shenzhen (CN)

(72) Inventors: Yuming Xia, Beihai (CN); En-tsung Cho, Beihai (CN); Lidan Ye, Beihai (CN)

(73) Assignees: BEIHAI HKC OPTOELECTRONICS TECHNOLOGY CO., LTD., Beihai (CN); HKC CORPORATION LIMITED, Shenzhen (CN)

( * ) Notice: Subject to any disclaimer, the term of this patent is extended or adjusted under 35 U.S.C. 154(b) by 228 days.

(21) Appl. No.: 17/194,484

(22) Filed: Mar. 8, 2021

(65) Prior Publication Data

US 2022/0037377 A1  Feb. 3, 2022

(30) Foreign Application Priority Data

Jul. 28, 2020 (CN) .......................... 202010740589.4

(51) Int. Cl.
*H01L 21/02* (2006.01)
*H01L 27/12* (2006.01)

(52) U.S. Cl.
CPC ...... *H01L 27/1259* (2013.01); *H01L 21/0214* (2013.01); *H01L 21/0217* (2013.01); *H01L 21/0228* (2013.01); *H01L 21/02164* (2013.01)

(58) Field of Classification Search
None
See application file for complete search history.

(56) References Cited

U.S. PATENT DOCUMENTS 5,917,199 A * 6/1999 Byun ................. H01L 27/1214
257/E27.141
6,750,066 B1  6/2004 Cheung et al.
(Continued)

FOREIGN PATENT DOCUMENTS

CN  101631894 A  1/2010
CN  106571300 A  4/2017
(Continued)

OTHER PUBLICATIONS

Notification to Grant Patent Right for Invention issued in counterpart Chinese Patent Application No. 202010740589.4, dated Aug. 12, 2022.
(Continued)

*Primary Examiner* — Asok K Sarkar
(74) *Attorney, Agent, or Firm* — Westbridge IP LLC

(57) ABSTRACT

Disclosed are a manufacturing method of an array substrate, an array substrate and a display device. The manufacturing method of the array substrate includes: providing a substrate; depositing and patterning a gate layer on the substrate; depositing a protective layer on the substrate covered with the gate layer by atomic layer deposition; and depositing and patterning an amorphous silicon layer and an ohmic contact layer on the protective layer. The uniform protective layer of the present disclosure reduces the influence on the field effect mobility of the thin film transistor, makes the display of the product more stable, and improves the display effect.

15 Claims, 3 Drawing Sheets

(56) References Cited

U.S. PATENT DOCUMENTS

| | | |
|---|---|---|
| 2006/0079042 A1 | 4/2006 | Han |
| 2006/0189154 A1 | 8/2006 | Ahn et al. |
| 2015/0099375 A1* | 4/2015 | Haripin ............. C23C 16/45523 438/793 |
| 2015/0179683 A1* | 6/2015 | Le ..................... H01L 29/78693 438/104 |
| 2017/0032972 A1 | 2/2017 | Tsai et al. |
| 2019/0267451 A1 | 8/2019 | Araoka et al. |
| 2019/0271074 A1 | 9/2019 | Ko et al. |

FOREIGN PATENT DOCUMENTS

| | | |
|---|---|---|
| CN | 110164878 A | 8/2019 |
| CN | 110379819 A | 10/2019 |
| CN | 110444478 A | 11/2019 |
| CN | 110838431 A | 2/2020 |
| JP | 2006278486 A | 10/2006 |
| TW | 200830417 A | 7/2008 |

OTHER PUBLICATIONS

First Office Action issued in counterpart Chinese Patent Application No. 202010740589.4, dated Mar. 18, 2022.

* cited by examiner

MANUFACTURING METHOD OF ARRAY SUBSTRATE, ARRAY SUBSTRATE AND DISPLAY DEVICE

CROSS REFERENCE TO RELATED APPLICATIONS

The present disclosure claims the priority of Chinese Patent Application No. 202010740589.4, filed on Jul. 28, 2020 and entitled "Manufacturing Method of Array Substrate, Array Substrate and Display Device", which is hereby incorporated by reference in its entirety.

TECHNICAL FIELD

The present disclosure relates to the field of display technology, and in particular to a manufacturing method of an array substrate, an array substrate, and a display device.

BACKGROUND

The statements here only provide background information related to the present disclosure, and do not necessarily constitute prior art.

With the continuous development of science and technology, more and more electronic products enter people's daily life and work, and these electronic products basically have display screens.

Thin Film Transistor-Liquid Crystal Display (TFT-LCD) is a technology for display screen production, in which Thin Film Transistor (TFT) is equipped with a semiconductor switch for each pixel, so as to achieve complete and independent control of a pixel. The liquid crystal material is clamped between the TFT glass layer and the color filter layer, and the final light intensity and color can be controlled by changing the voltage value that stimulates the liquid crystal.

The key to the development of TFT is the preparation of the array substrate, that is, by depositing various conductive layers and functional film patterns on the glass substrate to realize the electrical drive of the liquid crystal. The interface characteristics between the SiNx film and the amorphous silicon ($\alpha$-Si:H) film have a crucial influence on the field-effect mobility of the TFT. At the same time, the flatness of the SiNx film surface also has an obvious influence on the field-effect mobility, because it will affect the initial growth environment and defect state density of the amorphous silicon film that forming the TFT conductive channel. In related technologies, the SiNx film is prepared by Plasma Enhanced Chemical Vapor Deposition (PECVD). This deposition method is widely used in industrial production due to the advantages of low process temperature and fast deposition speed. However, the excessively fast deposition speed and the uncontrollable chemical reaction makes the surface flatness and uniformity of the SiNx film poor, resulting in the deterioration of the field-effect mobility of the TFT, which seriously affects the use of the product. In practice, plasma treatment may be used to improve the defect. However, it is easy to induce ion damage to the SiNx film during the plasma treatment process, resulting in degradation of TFT performance.

To sum up, the manufacturing method of the SiNx film in the related technology causes the field effect mobility of the TFT to deteriorate, which seriously affects the use of the product, and causes the display effect of the display screen to be poor.

SUMMARY

The main object of the present disclosure is to provide a manufacturing method of an array substrate, an array substrate, and a display device, aiming to solve the problem that the manufacturing method of the SiNx film causes the field effect mobility of TFT to deteriorate, which seriously affects the use of the product and causes the display effect of the display screen to be poor.

In order to achieve the above object, one aspect of the present disclosure provides a method for manufacturing an array substrate, including:
  providing a substrate;
  depositing and patterning a gate layer on the substrate;
  depositing a protective layer on the substrate covered with the gate layer by atomic layer deposition; and
  depositing and patterning an amorphous silicon layer and an ohmic contact layer on the protective layer.

After the gate layer is formed in the process of manufacturing the array substrate, the protective layer is deposited by the atomic layer deposition method. The atomic layer deposition method may form a uniform protective layer on the surface of the gate layer. The uniform protective layer reduces the impact on the field effect mobility of TFT, which makes the display of the product more stable and improves the display effect.

In an embodiment, depositing a protective layer on the substrate covered with the gate layer by atomic layer deposition includes:
  placing the substrate covered with the gate layer into a reaction chamber for atomic layer deposition, heating the reaction chamber to adjust a temperature to a preset temperature, and evacuating the reaction chamber to adjust a pressure to a preset pressure;
  controlling a silicon precursor source to be sent into and to stay in the reaction chamber for a first preset time period;
  controlling an inert gas to purge the reaction chamber for a second preset time period;
  controlling a nitrogen precursor source to be sent into and to stay in the reaction chamber for a third preset time period;
  controlling the inert gas to purge the reaction chamber for a fourth preset time period; and
  cyclically repeating the operations of controlling a silicon precursor source to be sent into and to stay in the reaction chamber for a first preset time period, controlling an inert gas to purge the reaction chamber for a second preset time period, controlling a nitrogen precursor source to be sent into and to stay in the reaction chamber for a third preset time period, and controlling the inert gas to purge the reaction chamber for a fourth preset time period, to form the protective layer on the substrate covered with the gate layer.

Depositing the protective layer by the atomic layer deposition method makes the protective layer more uniform, so that the field effect mobility of TFT will not be affected, and the stability of the display may be improved.

In an embodiment, the gate layer, the amorphous silicon layer and the ohmic contact layer are all formed by a mask process, and the protective layer is formed by a full-coverage coating process.

In an embodiment, the substrate is a cleaned glass substrate.

In an embodiment, the protective layer is an insulation layer.

In an embodiment, the protective layer includes silicon nitride, silicon oxide, or silicon oxynitride.

In an embodiment, the amorphous silicon layer includes $\alpha$-Si:H, and the ohmic contact layer includes n+$\alpha$-Si:H.

In an embodiment, the protective layer is deposited at a same deposition rate. The same deposition speed makes the protective layer on the gate layer more uniform.

In an embodiment, the deposition rate is no less than 1 angstroms per second, and no more than 20 angstroms per second.

In an embodiment, a thickness of the protective layer is no less than 2000 angstroms, and no more than 4000 angstroms.

In an embodiment, the silicon precursor source is one of silicon chloride, ethyl orthosilicate, aminosilane, and hexachlorodisilane; and the nitrogen precursor source is at least one of nitrogen, ammonia, and hydrazine.

In an embodiment, the preset temperature is no less than 150 degrees Celsius, and no more than 300 degrees Celsius, and the preset pressure is no less than 10 Pa, and no more than 100 Pa.

In addition, in order to achieve the above object, another aspect of the present disclosure provides an array substrate, which is manufactured by the manufacturing method of the array substrate as described above.

In an embodiment, the protective layer is deposited at a same deposition rate.

In addition, in order to achieve the above object, still another aspect of the present disclosure further provides a display device, which includes the array substrate as described above.

In the present disclosure, after the gate layer is formed in the process of manufacturing the array substrate, the protective layer is deposited by the atomic layer deposition method. The atomic layer deposition method may form a uniform protective layer on the surface of the gate layer. The uniform protective layer reduces the impact on the field effect mobility of TFT, which makes the display of the product more stable and improves the display effect.

The realization of the object of the present disclosure, functional characteristics, and advantages will be further described in conjunction with the embodiments and with reference to the accompanying drawings.

DETAILED DESCRIPTION OF THE EMBODIMENTS

It should be understood that the specific embodiments described herein are only used to explain the present disclosure, and are not used to limit the present disclosure.

A solution of the embodiments of the present disclosure comprises: providing a substrate; depositing and patterning a gate layer on the substrate; depositing a protective layer on the substrate covered with the gate layer by atomic layer deposition; and depositing and patterning an amorphous silicon layer and an ohmic contact layer on the protective layer.

In the display device in the related art, the manufacturing method of the SiNx film causes the field effect mobility of the TFT to deteriorate, which seriously affects the use of the product, and causes the display effect of the display screen to be poor. In the present disclosure, after the gate layer is formed in the process of manufacturing the array substrate, the protective layer is deposited by the atomic layer deposition method. The atomic layer deposition method may form a uniform protective layer on the surface of the gate layer. The uniform protective layer reduces the impact on the field effect mobility of TFT, which makes the display of the product more stable and improves the display effect.

Figure 1:
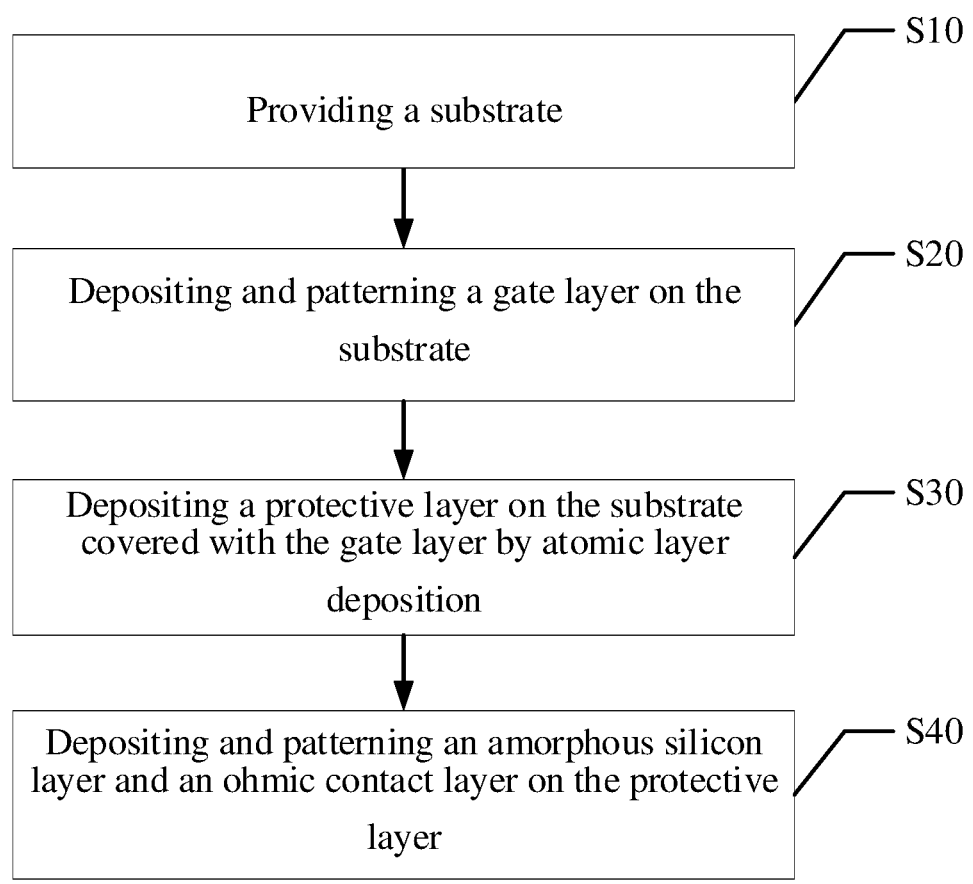
FIG. 1 is a schematic flowchart of a manufacturing method of an array substrate according to an embodiment of the present disclosure.

Referring to FIG. 1, an embodiment of the present disclosure provides a manufacturing method of an array substrate, including:

S10: providing a substrate.

In this embodiment, the Thin Film Transistor-Liquid Crystal Display (TFT-LCD) can display different colors and pictures because there is a pixel matrix composed of many R red pixels, G green pixels, and B blue pixels in the panel, and these pixels can display different colors under different brightness. The thin film transistors of the array substrate control the pixels to display different colors, and the thin film transistors turn on or off different switches according to the signals to control the display of different colors.

A substrate is provided, the substrate is a cleaned glass substrate.

S20: depositing and patterning a gate layer on the substrate.

The gate layer is an electrode layer, and the material of the gate layer may include at least one of copper, aluminum, and molybdenum. The material layer of the gate layer is coated on the substrate, and then a photoresist is applied. A mask is configured to form the pattern of the gate layer, the photoresist layer is left where the gate layer needs to be left, and the photoresist layer where the gate layer does not need to be left is washed away by etching to produce a patterned gate layer. The gate layer may include at least one of copper, aluminum, and molybdenum.

S30: depositing a protective layer on the substrate covered with the gate layer by atomic layer deposition.

After the gate layer is formed on the substrate, a protective layer is deposited on the substrate covered with the gate layer. The protective layer does not require a mask process, that is, this process does not require a photolithography process. The protective layer is an insulation layer, and the required material may be silicon nitride, silicon oxide, silicon oxynitride or other organic insulation materials. The film thickness ranges from 2000-4000 angstroms. Certainly, the film thickness may also be, for example, 1000-5000 angstroms according to display requirements. The protective layer is deposited by atomic layer deposition. The atomic layer deposition has good step coverage, so that a protective layer, that is, the SiNx film with high homogeneity and no cavity defects may be deposited uniformly on the surface of the gate layer of the array substrate.

S40: depositing and patterning an amorphous silicon layer and an ohmic contact layer on the protective layer.

An amorphous silicon layer and an ohmic contact layer are deposited on the substrate covered with a protective layer, and a pattern is formed on the substrate through a mask process, that is, the amorphous silicon layer and the ohmic contact layer where they are needed are reserved through the mask process to complete the coating of the amorphous silicon layer and the ohmic contact layer. The amorphous silicon layer and the ohmic contact layer may be deposited by Chemical Vapor Deposition (CVD), Plasma Enhanced Chemical Vapor Deposition (PECVD), or atomic layer deposition technology. The amorphous silicon layer refers to α-Si:H, and the ohmic contact layer refers to n+α-Si:H. After forming the amorphous silicon layer and the ohmic contact layer, a source electrode and a drain electrode are formed, and then a passivation layer is coated and a via hole is defined, and a conductive layer is coated.

In this embodiment, after the gate layer is formed in the process of manufacturing the array substrate, the protective layer is deposited by the atomic layer deposition method. The atomic layer deposition method may form a uniform protective layer on the surface of the gate layer. The uniform protective layer reduces the impact on the field effect mobility of TFT, which makes the display of the product more stable and improves the display effect.

Figure 2:
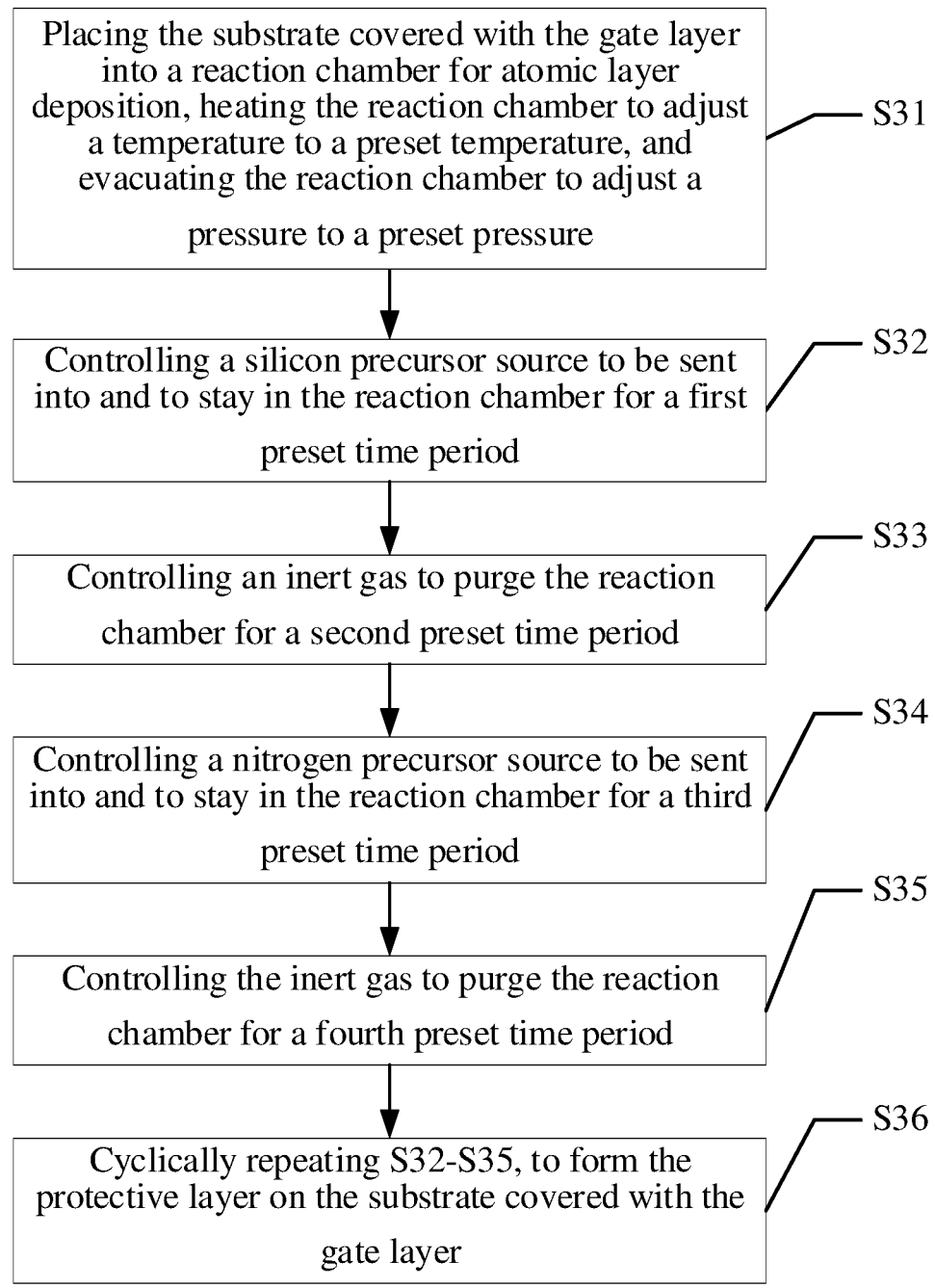
FIG. 2 is a schematic flowchart of depositing a protective layer by an atomic layer deposition method in FIG. 1 according to an embodiment of the present disclosure.

Referring to FIG. 2, in an embodiment, depositing a protective layer on the substrate covered with the gate layer by atomic layer deposition includes:

S31: placing the substrate covered with the gate layer into a reaction chamber for atomic layer deposition, heating the reaction chamber to adjust a temperature to a preset temperature, and evacuating the reaction chamber to adjust a pressure to a preset pressure.

S32: controlling a silicon precursor source to be sent into and to stay in the reaction chamber for a first preset time period.

S33: controlling an inert gas to purge the reaction chamber for a second preset time period.

S34: controlling a nitrogen precursor source to be sent into and to stay in the reaction chamber for a third preset time period.

S35: controlling the inert gas to purge the reaction chamber for a fourth preset time period.

S36: cyclically repeating S32-S35, to form the protective layer on the substrate covered with the gate layer.

When using the atomic layer deposition method to deposit the protective layer, first place the prepared array substrate with a first pattern (the gate layer) into an Atomic Layer Deposition (ALD) reaction chamber, and heat the reaction chamber to 180° C. and evacuate the reaction chamber to 50 Pa. After the temperature and the vacuum are stable, open a silicon precursor source control solenoid valve for 0.02 s. In this embodiment, $SiCl_4$ is configured as the silicon precursor source. Then $SiCl_4$ is controlled to stay in the reaction chamber for 0.03 s (the first preset time period, or other time period may be set, for example, 0.05 s, it may also be selected within a time period range, for example, 0.03 s-0.08 s) to be fully contacted and reacted with the substrate and the gate. Then inert gas Ar is controlled to purge for 5 s (the second preset time period, or other time period may be set, for example, 6 s, or it may be selected within a time period range, for example, 5 s-10 s) to purge the remaining $SiCl_4$ out of the reaction chamber. Similar to the above operations, open a nitrogen precursor electronic valve for 0.03 s. In this embodiment, $NH_3$ is configured as the nitrogen precursor source. Then $NH_3$ is controlled to stay in the reaction chamber for 20 s (the third preset time period, or other time period may be set, for example, 22 s, or it may be selected within a time period range, for example, 18 s-30 s) to be fully reacted with the $SiCl_4$ adsorbed on the substrate and the gate. Then inert gas Ar is controlled to purge for 20 s (the fourth preset time period, or other time period may be set, for example, 19 s, or it may be selected within a time period range, for example, 15 s-28 s) to purge the remaining $SiCl_4$ and reaction byproducts out of the reaction chamber. The above operations are repeated for 500 times (which may be set to other numbers, for example, 400 times, or may be selected from a range, for example, 200-800 times) to grow a uniform and dense silicon nitride film with a thickness of about 3000 angstroms on the surface of the gate and the substrate. The thickness of the protective layer may be 2000-4000 angstroms, which is not limited to 3000 angstroms. The silicon precursor source is one of silicon chloride, ethyl orthosilicate, aminosilane, and hexachlorodisilane; and the nitrogen precursor source is at least one of nitrogen, ammonia, and hydrazine. The preset temperature is no less than 150 degrees Celsius, and no more than 300 degrees Celsius, and the preset pressure is no less than 10 Pa, and no more than 100 Pa.

By using the atomic layer deposition method to deposit a uniform protective layer on the gate layer, the field effect mobility of the TFT is not affected, and the display effect is improved.

In an embodiment of the present disclosure, during the atomic layer deposition process, a same deposition rate is used to deposit the protective layer, and the deposition rate is no less than 1 angstroms per second, and no more than 20 angstroms per second. The SiNx film (protective layer) is deposited at the same deposition speed, so that the SiNx film has high film flatness and uniformity, few surface defects, and low interface state density. The amorphous silicon layer and the ohmic contact layer are continued to be deposited to assemble an array structure. The low interface state density between the SiNx film and the amorphous silicon film greatly improves the field-effect mobility of electrons, increases the on-state current of TFT, obtains a larger pixel aperture ratio, and reduces the response time of the panel. A dense SiNx film with no void defects has high homogeneity, high thickness uniformity, a higher dielectric constant, and a low leakage film, which makes the capacitance between the gate and the conductive channel larger and better improves the display effect.

Figure 3:
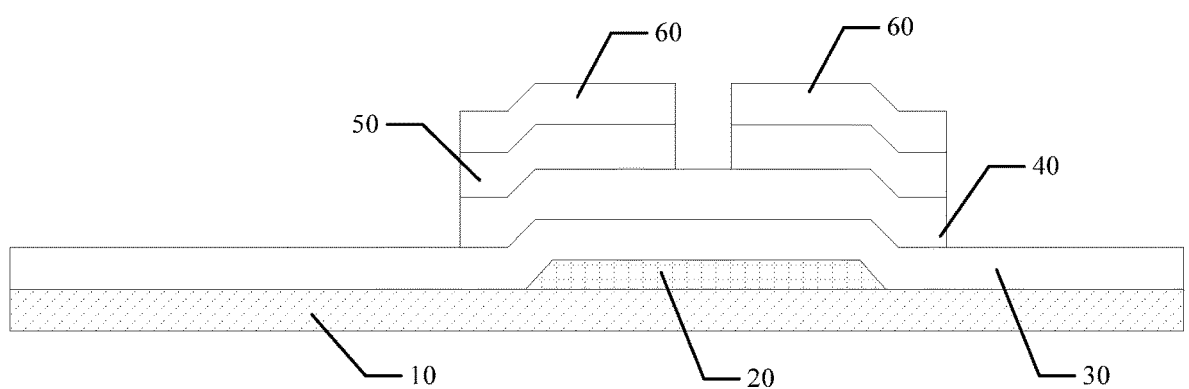
FIG. 3 is a schematic structural diagram of the array substrate according to an embodiment of the present disclosure.

In addition, an embodiment of the present disclosure further provides an array substrate. FIG. 3 is a schematic structural diagram of the array substrate. The array substrate is manufactured by the manufacturing method of the array substrate described in the above embodiments. The array substrate includes: a substrate 10; a gate layer 20, a protective layer 30, an amorphous silicon layer 40, and an ohmic contact layer 50 which are formed on the substrate. The protective layer 30 is deposited by an atomic layer deposition process.

The gate layer 20, the amorphous silicon layer 40 and the ohmic contact layer 50 all need to adopt a mask process to form the required patterns on the substrate 10. While the protective layer 30 is formed by a full-coverage coating process, and no photolithography process is required, that is, no mask process is required. After depositing the patterned gate layer 20, the protective layer 30 is deposited by atomic layer deposition with the same deposition speed, so that the protective layer 30 formed on the surface of the gate layer 20 is more uniform. Continue to deposit the amorphous silicon layer and the ohmic contact layer to assemble the array structure. The low interface state density between the SiNx thin film and the amorphous silicon thin film greatly increases the field effect mobility of electrons and makes the display effect better.

After the amorphous silicon layer 40 and the ohmic contact layer 50 are formed on the array substrate, a source/drain electrode 60 and a passivation layer are coated on the amorphous silicon layer 40 and the ohmic contact layer 50, after forming a via hole, a conductive layer is coated to complete the manufacturing of TFT.

In addition, an embodiment of the present disclosure further provides a display device, which includes the array substrate as described above.

The display device further includes: a counter substrate arranged opposite to the array substrate, and a display medium filled between the array substrate and the counter substrate. The display medium may be a liquid crystal layer, or other material medium with a display effect, for example, a light-emitting diode display medium or a dynamic series display medium.

The array substrate includes: a substrate 10; a gate layer 20, a protective layer 30, an amorphous silicon layer 40, and an ohmic contact layer 50 which are formed on the substrate. The protective layer 30 is deposited by an atomic layer deposition process.

The gate layer 20, the amorphous silicon layer 40 and the ohmic contact layer 50 all need to adopt a mask process to form the required patterns on the substrate 10. While the protective layer 30 is formed by a full-coverage coating process, and no photolithography process is required, that is, no mask process is required. After depositing the patterned gate layer 20, the protective layer 30 is deposited by atomic layer deposition with the same deposition speed, so that the protective layer 30 formed on the surface of the gate layer 20 is more uniform. Continue to deposit the amorphous silicon layer and the ohmic contact layer to assemble the array structure. The low interface state density between the SiNx thin film and the amorphous silicon thin film greatly increases the field effect mobility of electrons and makes the display effect better.

It should be noted that in this article, the terms "comprise", "include" or any other variant thereof are intended to cover non-exclusive inclusion, so that a process, method, article or system that includes a series of elements includes not only those elements, but also other elements that are not explicitly listed, or include elements inherent to this process, method, article, or system. Without more restrictions, the element defined by the sentence "comprise a . . . " does not exclude that there are other identical elements in the process, method, article or system that includes the element.

The sequence numbers of the above embodiments of the present disclosure are for description only, and do not represent the advantages and disadvantages of the embodiments.

Through the description of the above embodiments, those skilled in the art can clearly understand that the methods in the above embodiments can be implemented by means of software plus a necessary general hardware platform, and of course, can also be implemented by hardware, but in many cases the former is better. Based on this understanding, the technical solution of the present disclosure can be embodied in the form of a software product in essence or part that contributes to the existing technology, and the computer software product is stored in a storage medium (such as ROM/RAM, Magnetic disk, optical disk as described above), including several instructions to make a terminal device (which can be a mobile phone, computer, server, air conditioner, or network equipment, etc.) to implement the method described in each embodiment of the present disclosure.

The above are only optional embodiments of the present disclosure and do not limit the patent scope of the present disclosure. Any equivalent structure or equivalent process transformation made by the description and drawings of the present disclosure, or directly or indirectly used in other related technical fields are similarly included in the patent protection scope of the present disclosure.

What is claimed is:

1. A manufacturing method of an array substrate, comprising:
providing a substrate;
depositing and patterning a gate layer on the substrate;
depositing a protective layer on the substrate covered with the gate layer by atomic layer deposition; and
depositing and patterning an amorphous silicon layer and an ohmic contact layer on the protective layer;
wherein depositing a protective layer on the substrate covered with the gate layer by atomic layer deposition comprises:
placing the substrate covered with the gate layer into a reaction chamber for atomic layer deposition, heating the reaction chamber to adjust a temperature to a preset temperature, and evacuating the reaction chamber to adjust a pressure to a preset pressure;
controlling a silicon precursor source to be sent into and to stay in the reaction chamber for 0.03 s-0.08 s;
controlling an inert gas to purge the reaction chamber for 5 s-10 s;
controlling a nitrogen precursor source to be sent into and to stay in the reaction chamber for a 18 s-30 s;
controlling the inert gas to purge the reaction chamber for 15 s-28 s; and
cyclically repeating the operations of controlling a silicon precursor source to be sent into and to stay in the reaction chamber for 0.03 s-0.08 s, controlling an inert gas to purge the reaction chamber for 5 s-10 s, controlling a nitrogen precursor source to be sent into and to stay in the reaction chamber for 18 s-30 s, and controlling the inert gas to purge the reaction chamber for 15 s-28 s, to form the protective layer on the substrate covered with the gate layer.

2. The manufacturing method of the array substrate of claim 1, wherein the gate layer, the amorphous silicon layer and the ohmic contact layer are all formed by a mask process, and the protective layer is formed by a full-coverage coating process.

3. The manufacturing method of the array substrate of claim 1, wherein the substrate is a cleaned glass substrate.

4. The manufacturing method of the array substrate of claim 1, wherein the protective layer is an insulation layer.

5. The manufacturing method of the array substrate of claim 4, wherein the protective layer comprises silicon nitride, silicon oxide, or silicon oxynitride.

6. The manufacturing method of the array substrate of claim 1, wherein the amorphous silicon layer comprises $\alpha$-Si:H, and the ohmic contact layer comprises n+$\alpha$-Si:H.

7. The manufacturing method of the array substrate of claim 1, wherein the protective layer is deposited at a same deposition rate as a silicon layer deposition rate.

8. The manufacturing method of the array substrate of claim 7, wherein the deposition rate is no less than 1 angstroms per second, and no more than 20 angstroms per second.

9. The manufacturing method of the array substrate of claim 1, wherein a thickness of the protective layer is no less than 2000 angstroms, and no more than 4000 angstroms.

10. The manufacturing method of the array substrate of claim 1, wherein the silicon precursor source is one of silicon chloride, ethyl orthosilicate, aminosilane, and hexachlorodisilane; and the nitrogen precursor source is at least one of nitrogen, ammonia, and hydrazine.

11. The manufacturing method of the array substrate of claim 1, wherein the preset temperature is no less than 150 degrees Celsius, and no more than 300 degrees Celsius, and the preset pressure is no less than 10 Pa, and no more than 100 Pa.

12. An array substrate, manufactured by the manufacturing method of the array substrate of claim 1.

13. The array substrate of claim 12, wherein the protective layer is deposited at a same deposition rate as a silicon layer deposition rate.

14. A display device, comprising the array substrate of claim 12.

15. The display device of claim 14, wherein the protective layer is deposited at a same deposition rate as a silicon layer deposition rate.

\* \* \* \* \*